United States Patent
Hou et al.

(10) Patent No.: US 9,679,713 B2
(45) Date of Patent: Jun. 13, 2017

(54) KEY SWITCH AND ANALOG PRESSURE DETECTION SYSTEM INCLUDING THE SAME

(71) Applicant: UNEO INCORPORATED, Taipei (TW)

(72) Inventors: Chih-Sheng Hou, Taipei (TW); Cheng-Yen Tsai, Taipei (TW); Chia-Hung Chou, Taipei (TW)

(73) Assignee: Uneo Incorporated, Taipei (TW)

( * ) Notice: Subject to any disclaimer, the term of this patent is extended or adjusted under 35 U.S.C. 154(b) by 119 days.

(21) Appl. No.: 14/721,535

(22) Filed: May 26, 2015

(65) Prior Publication Data
US 2016/0351357 A1 Dec. 1, 2016

(51) Int. Cl.
*H01H 13/14* (2006.01)

(52) U.S. Cl.
CPC ....... *H01H 13/14* (2013.01); *H01H 2207/026* (2013.01)

(58) Field of Classification Search
CPC ............ H01H 13/785; H01H 2201/02; H01H 2231/016; H01H 13/12; H01H 13/52; H01H 13/70; H01H 59/0009; H01H 57/00; H01H 1/20; H01H 13/14; H01H 2207/026

USPC .... 200/344, 181, 534, 520, 510, 51.16, 333, 200/341

See application file for complete search history.

(56) References Cited

U.S. PATENT DOCUMENTS

| | | | | |
|---|---|---|---|---|
| 3,940,637 A | * | 2/1976 | Ohigashi | H03K 17/964 200/181 |
| 6,596,953 B2 | * | 7/2003 | Chu | H01H 13/70 200/341 |
| 8,766,125 B2 | * | 7/2014 | Chou | H01H 13/702 200/512 |
| 2012/0228109 A1 | * | 9/2012 | Wang | H01G 5/16 200/600 |

* cited by examiner

*Primary Examiner* — Edwin A. Leon
(74) *Attorney, Agent, or Firm* — Muncy, Geissler, Olds & Lowe, P.C.

(57) ABSTRACT

A key switch is disclosed. The key switch includes an axis, a pressure sensor layer, an axis component, and a key cap. The axis support includes a first opening. The pressure sensor layer is made of a pressure-sensitive electronic material and disposed on an upper surface of the axis support. The axis component is disposed in the first opening and vertically movable with respect to the axis support and the pressure sensor layer. The keycap is mounted on the axis component and includes a lower surface facing the upper surface of the axis support. When the keycap is depressed, the lower surface of the keycap depresses the pressure sensor layer and an electronic property of the pressure sensor layer varies. An analog pressure detection system including the key switch is also disclosed.

11 Claims, 10 Drawing Sheets

KEY SWITCH AND ANALOG PRESSURE DETECTION SYSTEM INCLUDING THE SAME

BACKGROUND OF THE INVENTION

1. Field of the Invention

This application relates to a key switch and an analog pressure detection system including the same, and more particularly, to a key switch and an analog pressure detection system including the same by utilizing a pressure sensor layer to provide an analog signal output.

2. Description of the Related Art

Currently, most of the key switches for keyboards in the market can only provide digital outputs. That is, such key switches can only detect if the user press it or not but cannot detect the intensity of the pressing force. Under some circumstances, the function of detecting the pressing intensity and then outputting an analog signal is in need. For example, the analog signal reflecting the pressing force can be used as a control signal for a video game, and thus the game designers can have more flexibility to produce the video game.

Although some conventional key switches have provided the function of detecting the pressing force, those key switches usually have some disadvantages. Some of those key switches require extra electronic device for sensing press force, and the product cost may be thereby increased. Alternatively, in the designs of some of those key switches, the sensing elements are disposed at the bottom of the whole structures, which may not be applicable to some keyboard structures. For example, there may be no extra space to accommodate the sensing element at the bottom of the key switch, or there may be other structures such as circuit board already present at the bottom of the key switch, which should not be blocked by the sensing element.

SUMMARY OF THE INVENTION

In view of the aforementioned technical problems, the objective of the present invention provides a key switch, which can be used to detect the intensity of the pressing force by a pressure sensor layer disposed in the middle of the structure.

According to one objective of the present invention, a key switch is provided. The key switch includes an axis support, a pressure sensor layer, an axis component, and a key cap. The axis support includes a first opening. The pressure sensor layer includes a thin film and pressure-sensitive electronic material and disposed on an upper surface of the axis support. The axis component is disposed in the first opening and vertically movable with respect to the axis support and the pressure sensor layer. The keycap is mounted on the axis component and includes a lower surface facing the upper surface of the axis support. When the keycap is depressed, the lower surface of the keycap depresses the pressure sensor layer and an electronic property of the pressure sensor layer varies.

Preferably, the pressure sensor layer may further include a second opening corresponding to the first opening, and the axis component may be disposed in the first and second openings.

Preferably, the keycap may further include a recess on the lower surface thereof Preferably, the area of the upper surface of the axis support may be equal to or smaller than an area difference between the recess of the keycap and the axis component in a section view.

Preferably, a width of the pressure sensor layer at one side of the second opening is larger than a width of the pressure sensor layer at another side of the second opening in a section view.

Preferably, the pressure sensor layer may be disposed at one side of the first opening and may be rectangular.

Preferably, the pressure sensor layer may be disposed at three sides of the first opening and may be U-shaped.

Preferably, the conductance of the pressure sensor layer may be positively correlated with the pressure applied on the pressure sensor layer.

Preferably, a minimal width of a surface of the pressure sensor layer facing the lower surface of the keycap may be larger than 1 mm.

Preferably, the keycap may further include a protruding part disposed on the lower surface and corresponding to the pressure sensor layer.

According to another objective of the present invention, an analog pressure detection system is provided. The analog pressure detection system includes the aforementioned key switch, a voltage source, and a voltage detector. The voltage source is connected to the pressure sensor layer of the key switch through a reference resistor. The voltage detector is connected to the voltage source and the pressure sensor layer.

As mentioned above, the key switch in accordance with the present invention may have one or more advantages as follows.

1. The key switch in accordance with the present invention is able to be used to detect the intensity of the pressing force by the pressure sensor layer made of a pressure-sensitive electronic material.

2. The key switch in accordance with the present invention is able to be produced by simple processes due to the layer structure of the pressure sensor layer.

3. The key switch in accordance with the present invention is able to provide flexibility for the keyboard design since the space at the bottom of the key switch is not occupied by the sensing element.

BRIEF DESCRIPTION OF THE DRAWINGS

Hereinafter, embodiments of the present invention will be described in detail with reference to the accompanying drawings so that those skilled in the art to which the present invention pertains can realize the present invention, wherein.

DETAILED DESCRIPTION OF THE PREFERRED EMBODIMENTS

Hereinafter, embodiments of the present invention will be described in detail with reference to the accompanying drawings so that those skilled in the art to which the present invention pertains can realize the present invention. As those skilled in the art would realize, the described embodiments may be modified in various different ways, all without departing from the spirit or scope of the present invention.

Figure 1:
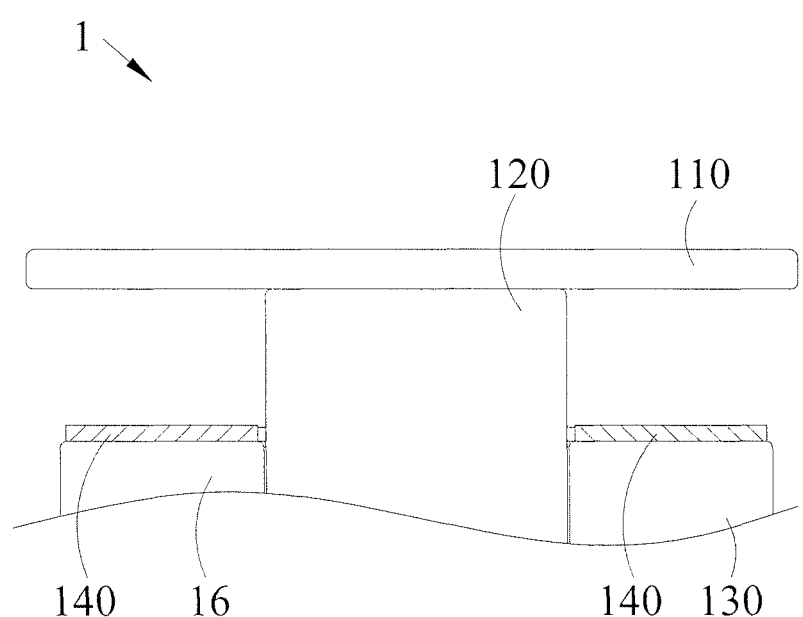
FIG. 1 is a schematic diagram of a key switch according to a first embodiment of the present invention.

Please refer to FIG. 1, which is a schematic diagram of a key switch 1 according to the first embodiment of the present invention. In FIG. 1, the key switch 1 includes an axis support 130, a pressure sensor layer 140, an axis component 120, and a key cap 110. The axis support 130 includes a first opening 131. The pressure sensor layer 140 includes a thin film and pressure-sensitive electronic material and disposed on an upper surface of the axis support 130. The axis component 120 is disposed in the first opening 131 and vertically movable with respect to the axis support 130 and the pressure sensor layer 140. The keycap 110 is mounted on the axis component 120 and includes a lower surface facing the upper surface of the axis support 130. When the keycap 110 is depressed, the lower surface of the keycap 110 depresses the pressure sensor layer 140 and an electronic property of the pressure sensor layer 140 varies.

The key switch 1 of the embodiment of the present invention can not only detect if the keycap 110 is depressed or not, but also detect the intensity of the pressing force while being pressed. In particular, the keycap 110 is mounted on the axis component 120, and the axis component 120 is disposed in the first opening 131 of the axis support 130 and vertically movable with respect to the axis support 130 and the pressure sensor layer 140. Therefore, when the keycap 110 is depressed, the keycap 110 with the axis component 120 moves downward in respect to the axis support 130.

Figure 2:
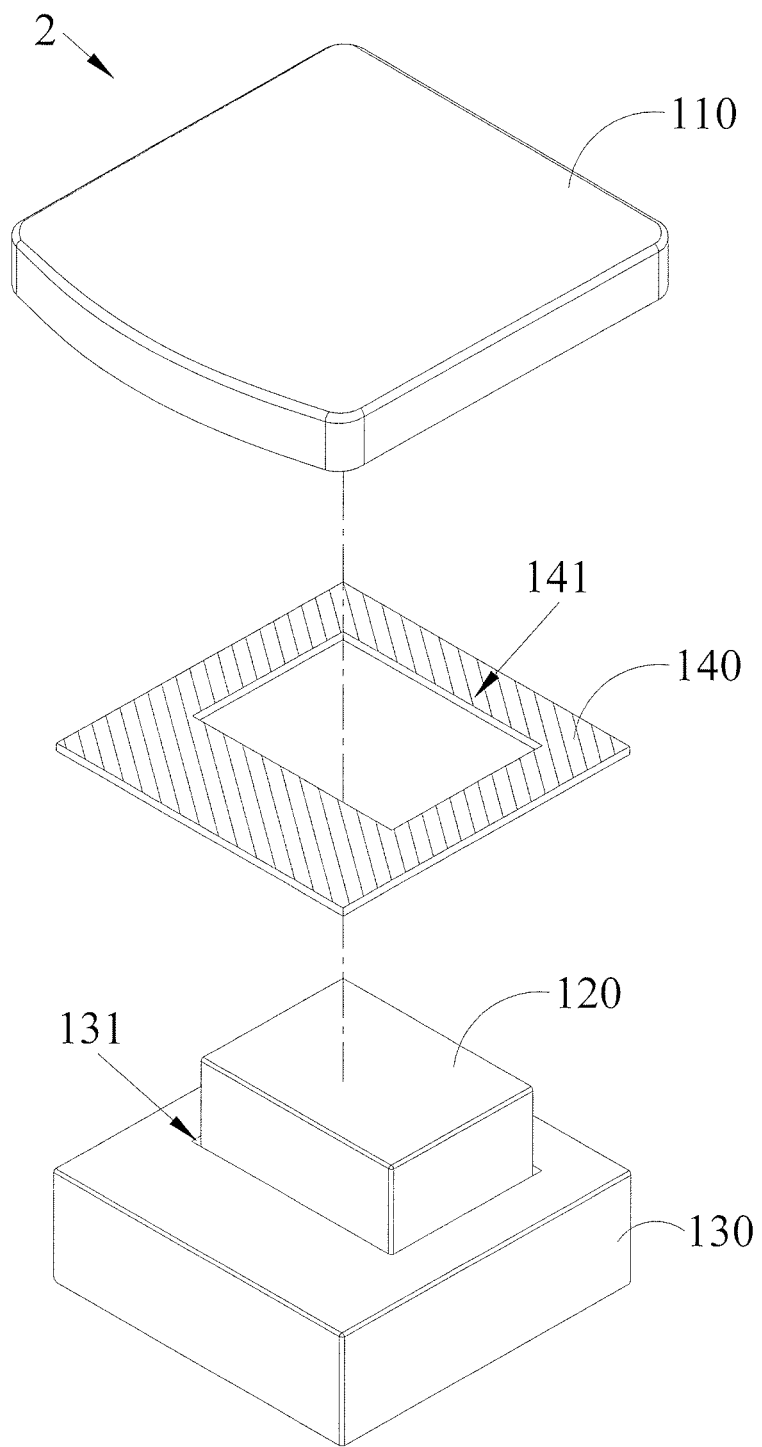
FIG. 2 is an exploding diagram of a key switch according to a second embodiment of the present invention.

Please refer to FIG. 2, which is an exploding diagram of a key switch 2 according to a second embodiment of the present invention. In FIG. 2, the pressure sensor layer 140 of the key switch 2 may further include a second opening 141 corresponding to the first opening 131, and the axis component 2 may be disposed in the first opening 131 and second opening 141.

To further simplify the process, the pressure sensor layer 140 can be formed in a shape similar to the upper surface of the axis support 130. That is, the pressure sensor layer 140 may include the second opening 141 corresponding to the first opening 131 of the axis support 130, and the axis component 120 can be disposed therein as well. However, the present invention is not limited thereto. In some embodiments of the present invention, the pressure sensor layer 140 may include two or more separate bands or lines disposed on the upper surface of the axis support 130 in one key switch.

Specifically, the second opening 141 can be equal to or smaller than the first opening 131.

The elements of the key switch 2 can be assembled in the order shown in FIG. 2, or integrally produced in a series of processes. In a preferred embodiment, the pressure sensor layer 140 is can be disposed on an upper surface of the axis support 130 by printing process. Therefore, the pressure sensor layer 140 can be formed as a layer with substantially uniform thickness. Since the printing process can be easily added to the original key switch producing processes, the product cost of the key switch according to the present invention can still keep low. That is, the key switch 2 according to the present invention can be produced without causing significant cost increase.

Figure 3:
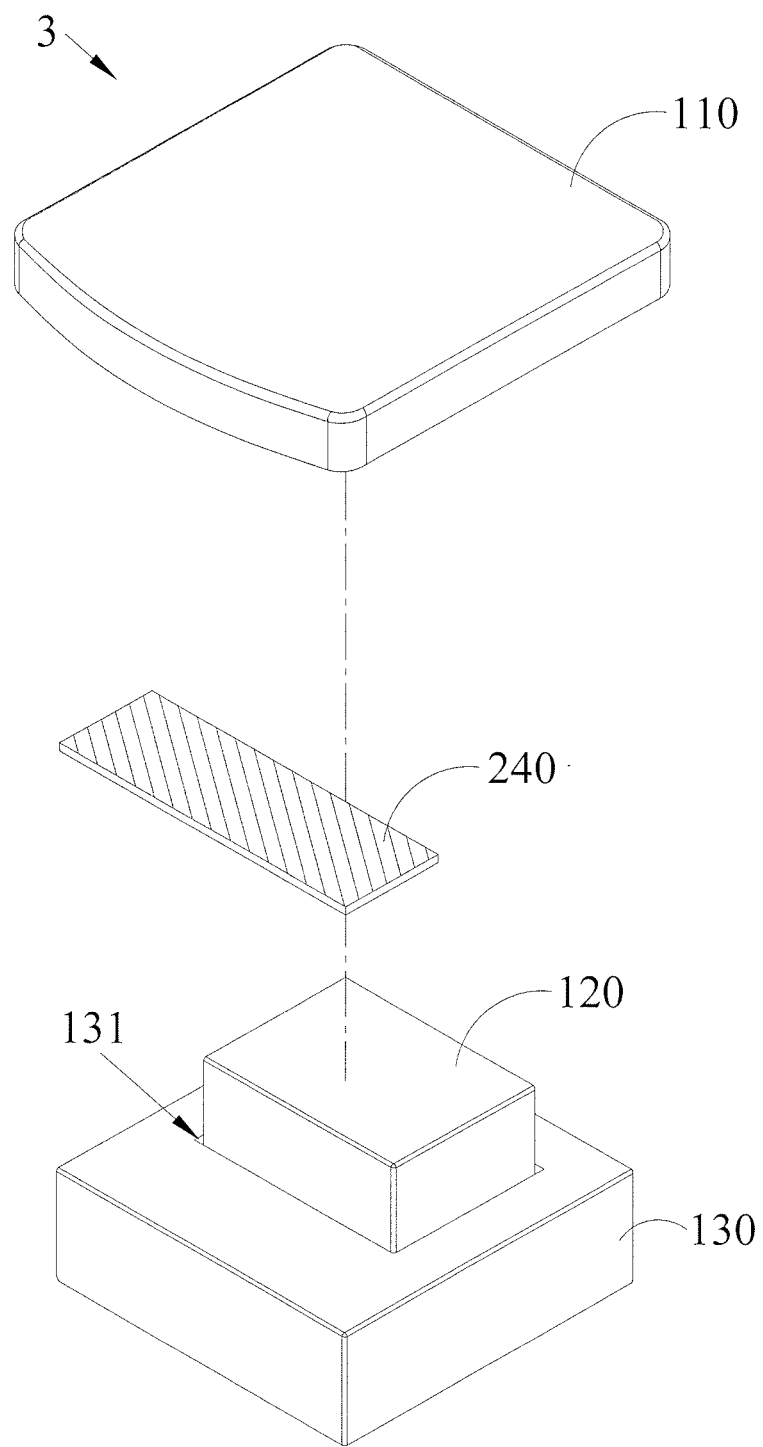
FIG. 3 is an exploding diagram of a key switch according to a third embodiment of the present invention.

Please refer to FIG. 3, which is an exploding diagram of a key switch according to a third embodiment of the present invention. In FIG. 3, the pressure sensor layer 240 may be disposed at one side of the first opening 131 and may be rectangular. As mentioned above, the pressure sensor layer of the key switch of the present invention is not limited to the structure with an opening. In this embodiment, the key switch 3 is similar to the key switch 2 of the second embodiment except the shape of the pressure sensor layer 240, which has a rectangle shape instead of a hollow shape. Since the structure of the pressure sensor layer 240 is relatively simple, the manufacturing process. The material used to form the pressure sensor layer 240 may be saved as well.

Figure 4:
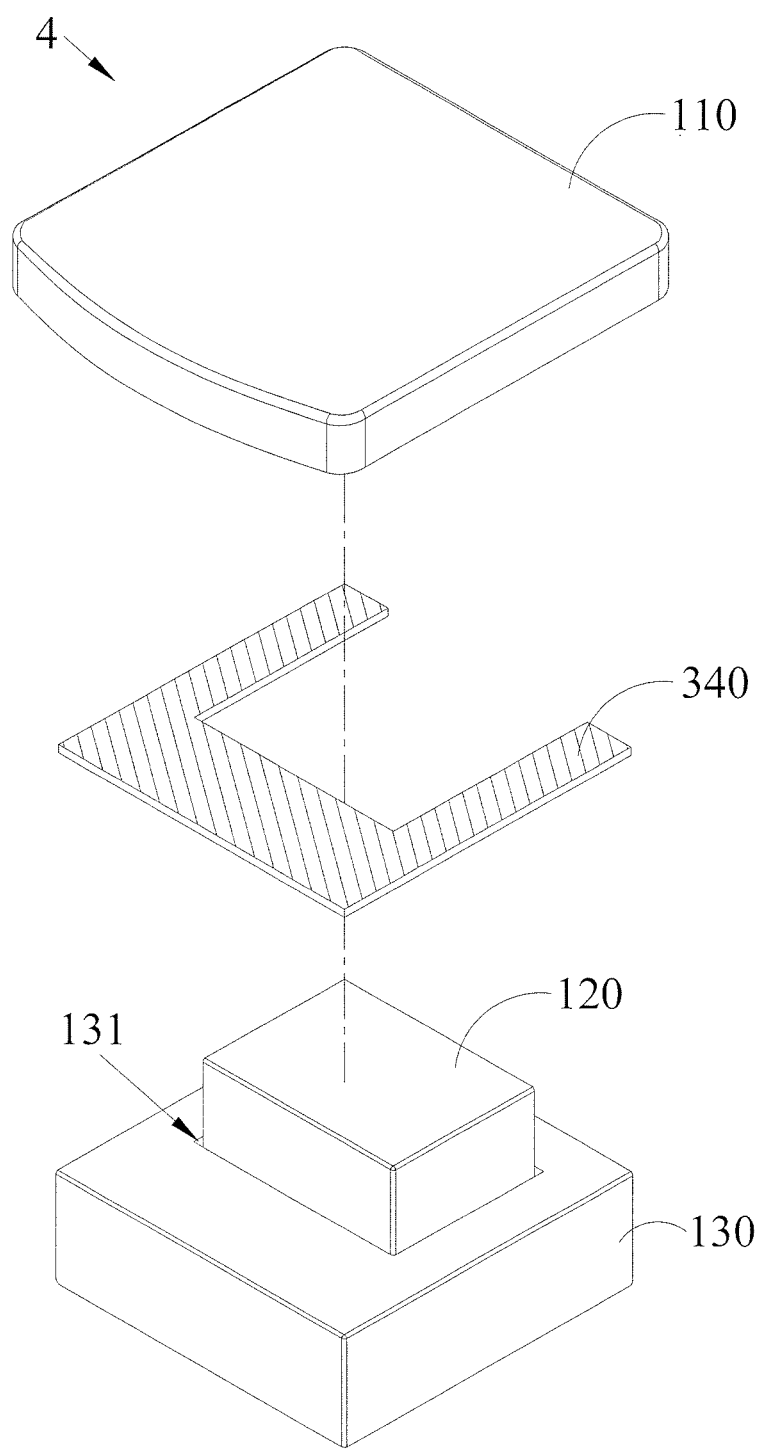
FIG. 4 is an exploding diagram of a key switch according to a fourth embodiment of the present invention.

Please refer to FIG. 4, which is an exploding diagram of a key switch according to a fourth embodiment of the present invention. In FIG. 4, the pressure sensor layer 340 may be disposed at three sides of the first opening 131 and may be U-shaped. In this embodiment, the pressure sensor layer 340 of the key switch 4 has a "U" shape instead of a hollow shape or a rectangular shape. Hence, in this embodiment, the sensing area of the pressure sensor layer 340 is larger than that of the pressure sensor layer 240 of the third embodiment, and the used material of the pressure sensor layer 340 is less than that of the pressure sensor layer 140. Therefore, this embodiment can provide a compromise accuracy and cost.

Figure 5:
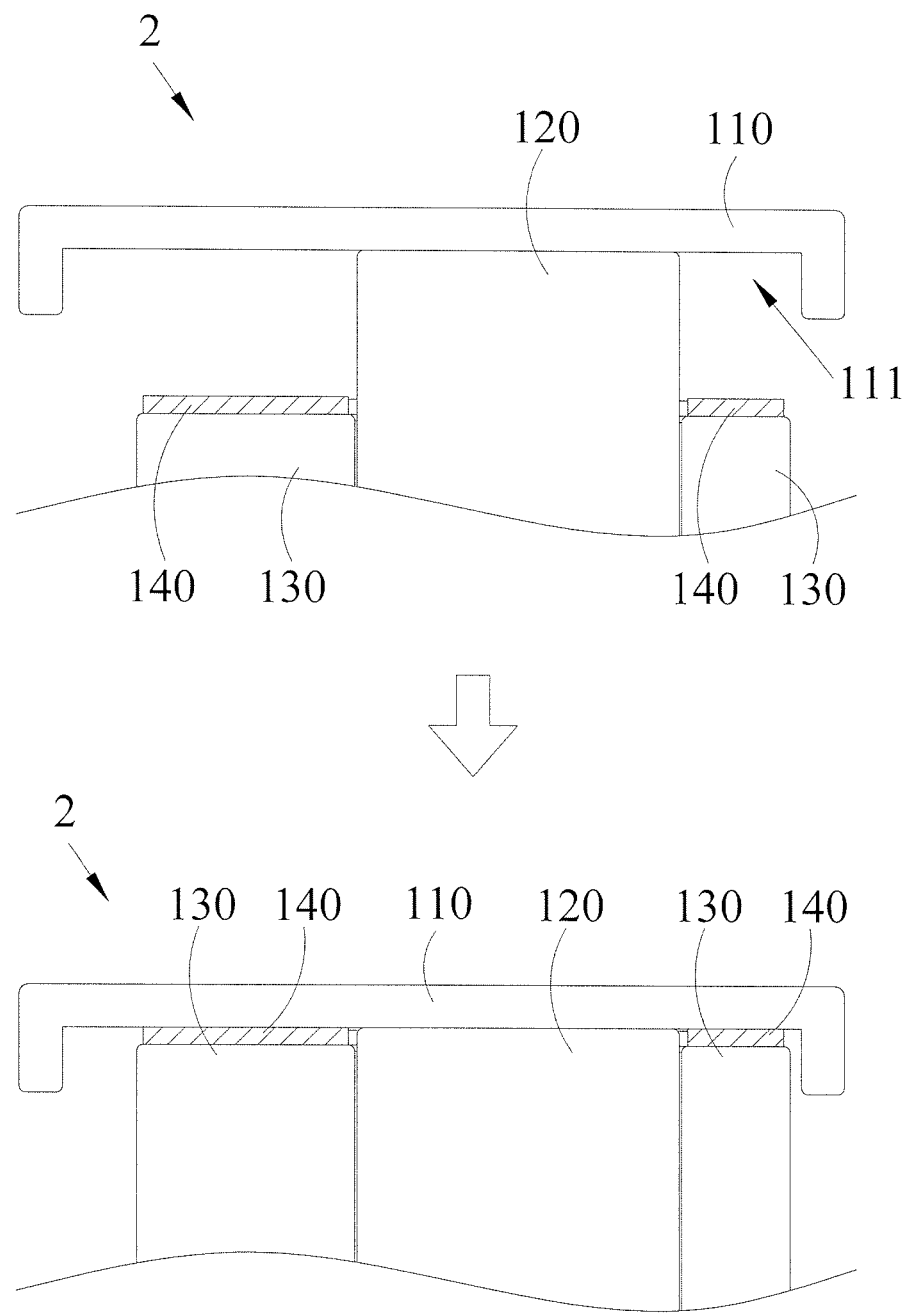
FIG. 5 is an operating schematic diagram of the key switch according to the second embodiment of the present invention.

Please refer to FIG. 5, which is an operating schematic diagram of the key switch 2 according to the second embodiment of the present invention. In FIG. 5, when the keycap 110 is depressed, the lower surface of the keycap 110 depresses the pressure sensor layer 140 and the electronic property of pressure sensor layer 140 varies according to a pressure applied on the keycap.

As shown in FIG. 5, as the pressing force is large enough, the lower surface of the keycap 110 can be in contact with the pressure sensor layer 140. Since the pressure sensor layer 140 includes a thin film and pressure-sensitive electronic material, the electronic property of the pressure sensor layer 140 can change at this moment. This change can be easily detected by typical scanning method, such as applying voltage or current thereon and then measuring the change of value. Therefore, based on the occurrence of the change of the electronic property of the pressure sensor layer 140, the time when the keycap 110 is depressed can be known. Moreover, based on the change value of the electronic property of the pressure sensor layer 140, the intensity of the pressing force can be quantified.

Figure 6:
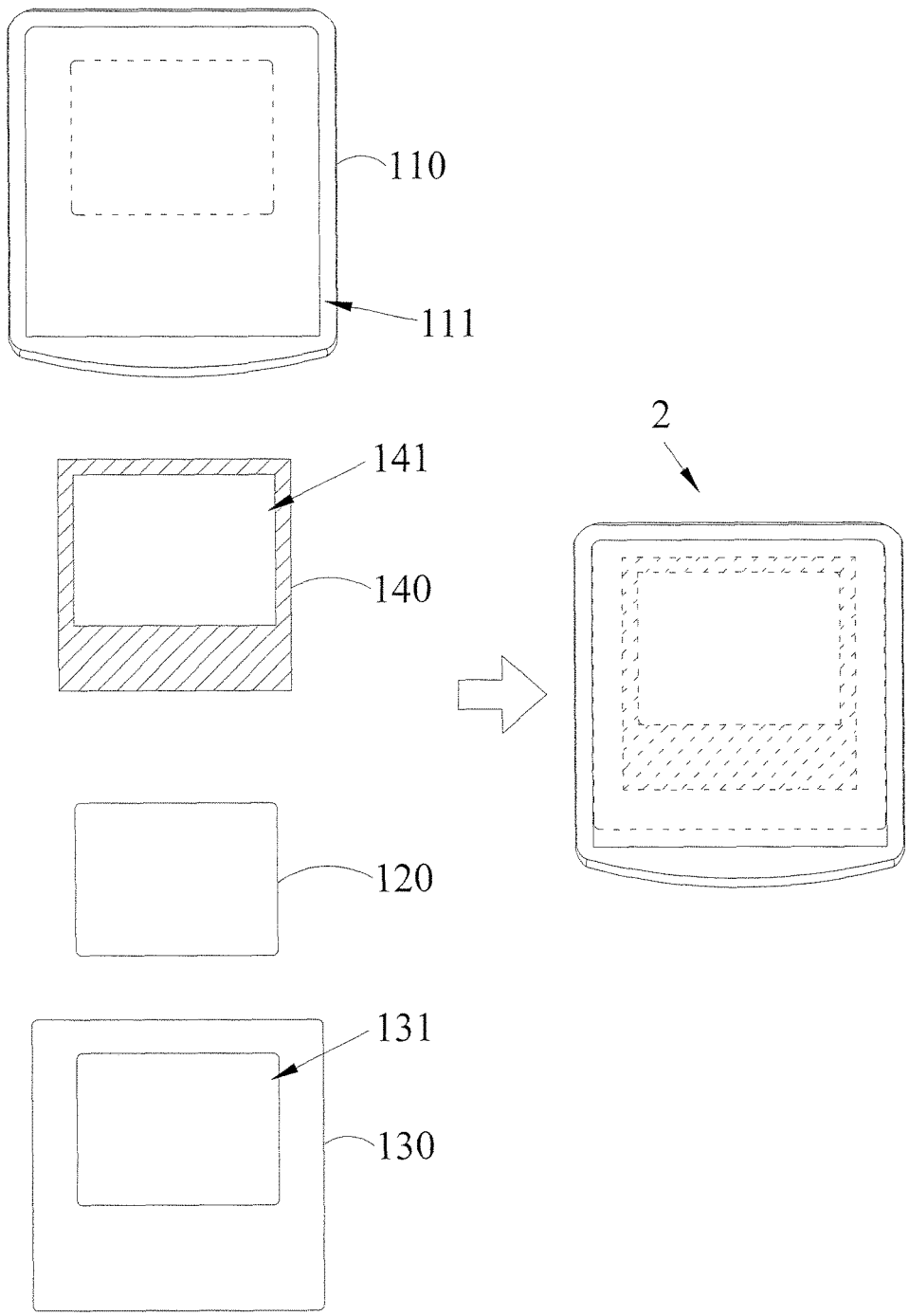
FIG. 6 is a schematic diagram showing the area for each element of the key switch according to the second embodiment of the present invention.

Please refer to FIG. 5 again. In FIG. 5, the keycap 110 may further include a recess 111 on the lower surface thereof Please refer to FIG. 6, which is a schematic diagram showing the area for each element of the key switch 2 according to the second embodiment of the present invention. In FIG. 6, the area of the upper surface of the axis support 130 may be equal to or smaller than an area difference between the recess 111 of the keycap 110 and the axis component 120 in a section view.

Figure 7:
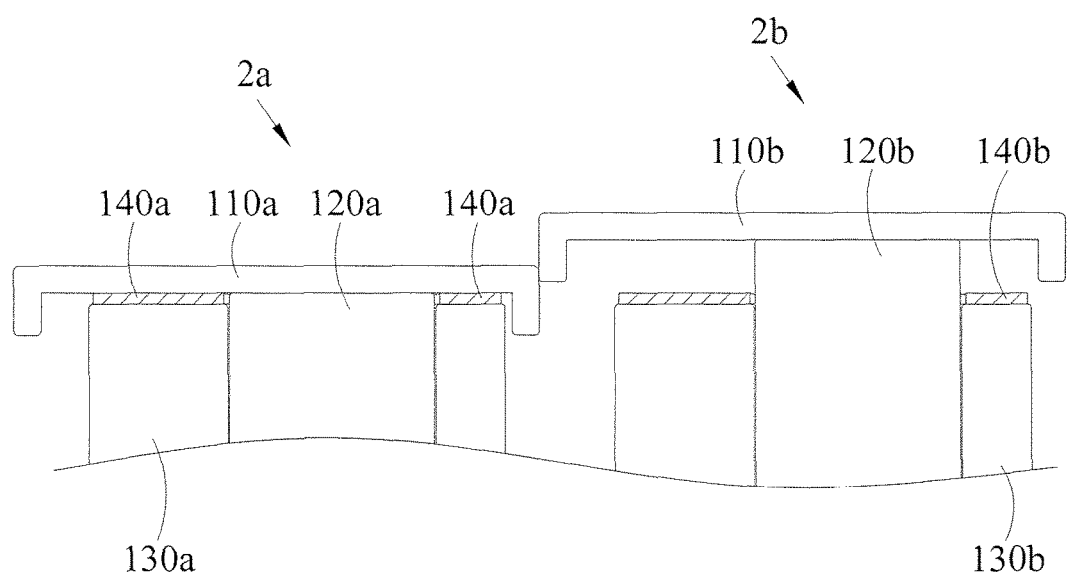
FIG. 7 is an operating schematic diagram of the key switches according to the second embodiment of the present invention.

To protect the pressure sensor layer 140, the recess 111 can be formed on the lower surface, which faces the pressure sensor layer 140, of the keycap 110. At the left-hand side of FIG. 6, the dashed rectangular in the region of the recess 111 indicates the area of the axis component 120. As can be seen more clearly at the right-hand side of FIG. 6, the area of the upper surface of the axis support 130 may be equal to or smaller than an area difference between the recess 111 of the keycap 110 and the axis component in the section view. The effect of this design can be seen in FIG. 7, which is an operating schematic diagram of the key switches 2a and 2b according to the second embodiment of the present invention. When the keycap 110a is depressed, the outer side wall of the keycap 110b is exposed. The outer side wall of the keycap 110b can prevent object such as dust particles from entering the gap between the keycap 110b and the pressure sensor layer 140b. As a result, it is more difficult for the object from the outside to reach and be attached on the surface of the pressure sensor layer 140b, and the uniformity of the surface of the pressure sensor layer 140b can be kept. Hence, the precision of the detection function of the pressure sensor layer 140b can be maintained, and the reliability of the key switch can be improved.

Preferably, the area of the upper surface of the axis support 130 may be slightly smaller than an area difference between the recess 111 of the keycap 110 and the axis component 120 in a section view, and the area of the pressure sensor layer 140 may be slightly smaller than that of the upper surface of the axis support 130. As a result, the air originally existing at the gap between the keycap 110 and the pressure sensor layer 140 can be smoothly put out from the gap between the side wall of the keycap 110 and the axis support 130 while the keycap 110 is being pressed. Similarly, while the keycap 110 is released, the air can smoothly flow back through the gap between the side wall of the keycap 110 and the axis support 130. Therefore, a user can type a keyboard including the key switches 2a and 2b of this embodiment without feeling additional resistance.

Figure 8:
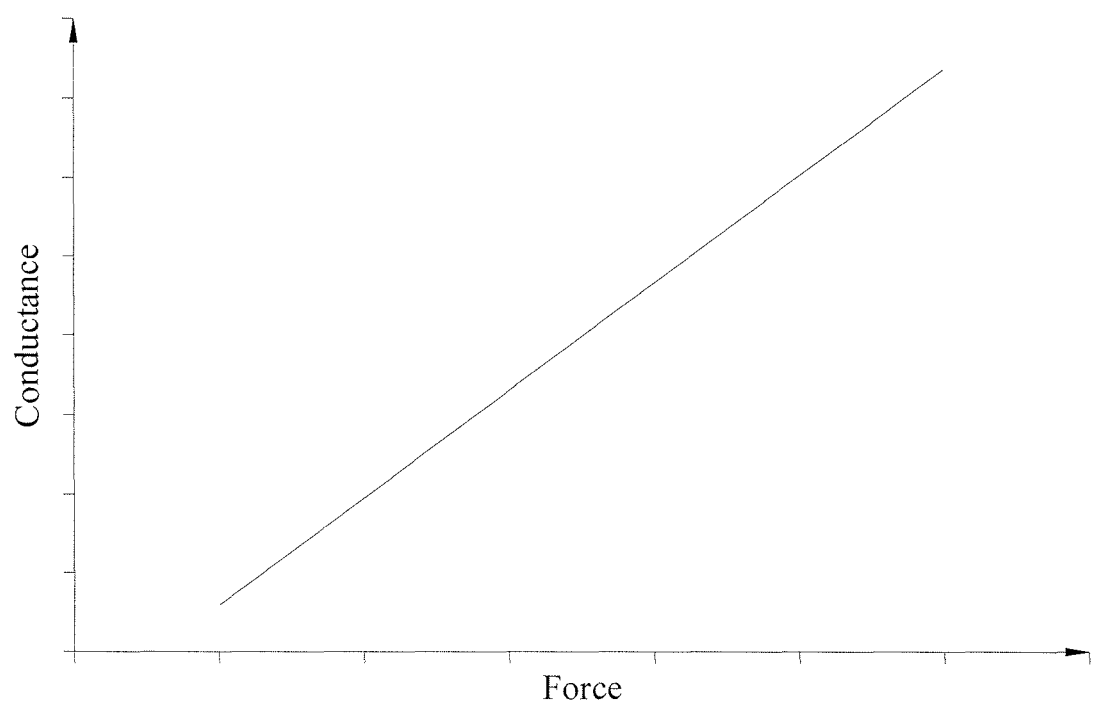
FIG. 8 is a graph showing the relationship between the conductance of the pressure sensor layer and the applied force according to the fifth embodiment of the present invention.

Please refer to FIG. 8, which is a graph showing the relationship between the conductance of the pressure sensor layer and the applied force according to the second embodiment of the present invention. In FIG. 8, the conductance of the pressure sensor layer 140 is positively correlated with the pressure applied on the pressure sensor layer 140. That is, the resistance of the pressure sensor layer 140 is negatively correlated with the intensity of the pressing force applied on the pressure sensor layer 140. In summary, the electronic property, such as the conductance, of the pressure sensor layer 140 can be linearly correlated with the pressure in an operating range.

Since the relationship between the resistance or the conductance of the pressure sensor layer 140 and the applied force can be simple, the intensity of the applied force can be readily calculated if the variation of the resistance or the conductance of the pressure sensor layer 140 is known. Therefore, when the key switch in accordance with this embodiment of the present invention is disposed in a pressure detection system or circuit, the processor does not require complex algorithm to derive the intensity of the applied force. Namely, the signal processing efficiency can be further improved.

Figure 9:
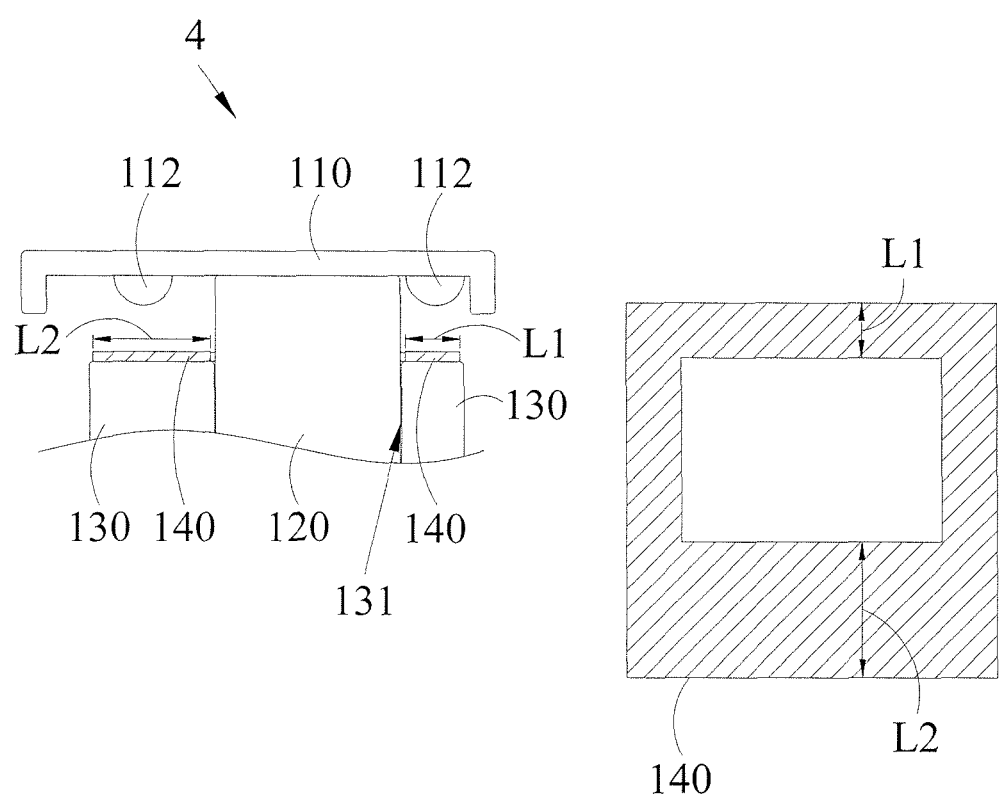
FIG. 9 is a schematic diagram of a key switch according to the sixth embodiment of the present invention.

Please refer to FIG. 9, which is a schematic diagram of a key switch 4 according to the sixth embodiment of the present invention. In FIG. 9, the pressure sensor layer 140 has an opening in the middle and a width L2 of the pressure sensor layer 140 at one side of the second opening 131 and the axis component 120 (at the left-hand side of FIG. 9) is larger than a width L1 of the pressure sensor layer at another side of the second opening 131 and the axis component 120 (at the right-hand side of FIG. 9) in a section view.

Considering the typing habit of common users, it is rare for the center of the keycap to be pressed. In other words, the pressing force applied to the key switch is usually asymmetric. The side of the key switch closer to the user normally receives larger component of force. Under this situation, the pressure sensor layer 140 can be designed in an asymmetric form with respect to the axis component 120. In particular, the area of the pressure sensor layer 140 can be larger at a side of the second opening 141 further from the user than that at another side of the second pending 141 closer to the user. Therefore, the effect caused by the asymmetric pressing force can be compensated. The circuit for scanning and detecting the analog signal can be changed accordingly so as to increase the accuracy.

Moreover, since the pressure sensor layer 140 in fact surround the axis component 120, the pressure sensor layer 140 in four directions corresponding to the axis component 120 should receive the pressing force and the electronic property varies accordingly while the keycap 110 is depressed. Therefore, even if the pressing force is not evenly distributed on the surface of the pressure sensor layer (for example, the axis component 120 may not exactly fit the first opening 131 and the second opening 141 so that the axis component 120 moves in respect to the axis support 130 at a slightly oblique angle), the pressure sensor layer 140 can still sense the force change and then the electronic property of the pressure sensor layer 140 changes accordingly. Namely, the pressure sensor layer 140 increases the tolerance for the input pressing force, which may benefit the following signal analysis. In contrast, in the case that the sensing elements are only disposed at one side or two sides of the axis component 120, the pressing force may not be successfully transferred to those sensing elements when the pressing force is not distributed evenly. As a result, those sensing elements may generate the analog signal in error or cannot generate the analog signal.

Please refer to FIG. 9 again. In FIG. 9, a minimal width of a surface of the pressure sensor layer 140 facing the lower surface of the keycap 110 may be larger than 1 mm.

In order to achieve better effect of detecting pressing force, the minimal width of a surface of the pressure sensor layer 140 should be larger than 1 mm. In this embodiment, such minimal width of the pressure sensor layer 140 is schematically shown in FIG. 9 is the width L1. When the width L1 of the pressure sensor layer 140 is smaller than 1 mm, the resolution of detecting the pressing force may be too low to be clearly recognized.

Preferably, the keycap 110 may further include a protruding part 112 disposed on the lower surface and corresponding to the pressure sensor layer 140.

If the resolution of detecting the pressing force needs to be further improved, the shape of the keycap 110 can be changed correspondingly. In particular, some parts of the lower surface of the keycap 110 can stick out to correspond to the part of the pressure sensor layer 140 where the minimal width is. Please refer to FIG. 9 again. When the keycap 110 is depressed, the protruding part 112 may be in contact with the part where the minimal width of the pressure sensor layer 140 is and thereby the pressing force can be fully transferred to the pressure sensor layer 140 so as to increase the resolution. It is worth noting that the shape of the protruding part 112 can be various according to the design choice. For example, the protruding part 112 can be a bulge, a prism, or a pyramid. In some embodiments, the protruding part 112 is integrally formed with the keycap 110, but the present invention is not limited thereto. For example, the material of the protruding part 112 may be different from that of the keycap 110, and the protruding part 112 is attached to the lower surface of the keycap 110 after being formed.

Figure 10:
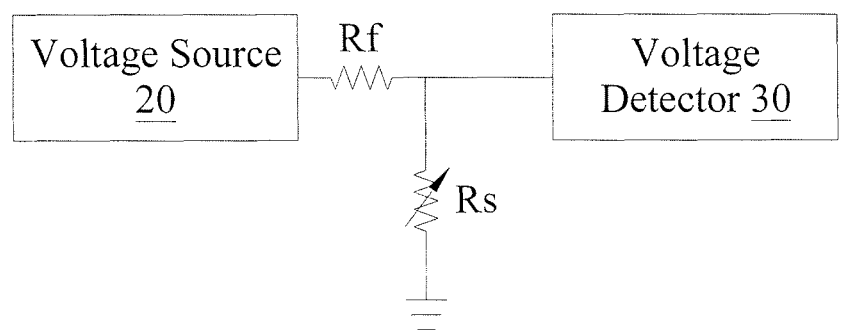
FIG. 10 is a schematic circuit diagram showing an analog pressure detection system according to the seventh embodiment of the present invention.

Please refer to FIG. 10, which is a schematic circuit diagram showing an analog pressure detection system according to the seventh embodiment of the present invention. In FIG. 10, the analog pressure detection system includes the aforementioned key switch (e.g., the key switch 1, 2, or 4), a voltage source 20, and a voltage detector 30. The voltage source 20 is connected to the pressure sensor layer (represented by a variable resistor Rs) of the key switch through a reference resistor Rf. The voltage detector 30 is connected to the voltage source 20 (through a reference resistor Rf) and the pressure sensor layer Rs.

In this embodiment, an analog pressure detection system including the key switch in accordance with the present invention is disclosed. As shown in FIG. 10, when the voltage source 20 and the reference resistor Rf is provided, the voltage source 20 can provide an input voltage Vi. Therefore, when the voltage detector 30 is connected to other elements as shown in FIG. 10, the voltage detector can receive an output voltage Vo, which is a divided voltage of the input voltage Vi. In particular, the output voltage Vo may be simply expressed by the equation: $Vo=Vi*Rs/(Rs+Rf)$. As mentioned above, the conductance or the resistance of the pressure sensor layer Rs varies when an external force is applied thereto. Therefore, the detected output voltage Vo varies with the conductance or the resistance of the pressure sensor layer Rs. Based on the variation of the detected output voltage Vo, the intensity of the pressing force can be easily derived if the relationship between the conductance or the resistance of the pressure sensor layer Rs and the applied force is known. Such relationship can be determined by the electronic property as described in the aforementioned fifth embodiment (please refer to FIG. 8). In this embodiment, only the simplest circuit structure is shown, but the present invention is not limited thereto. For example, the voltage source 20 can be connected to the pressure sensor layer Rs through pressure sensor layers of other key switches, or the voltage detector 30 can further be connected to an analog to digital converter (A/D converter) to define the output voltage in different levels for the following uses. Therefore, those levels of the output voltage can be utilized as the input parameters for some programs so that the flexibility and convenience of program development may be improved.

While the means of specific embodiments in present invention has been described by reference drawings, numerous modifications and variations could be made thereto by those skilled in the art without departing from the scope and spirit of the invention set forth in the claims. The modifications and variations should in a range limited by the specification of the present invention.

What is claimed is:

1. A key switch, comprising:
   an axis support, comprising a first opening;
   a pressure sensor layer, comprising a thin film and pressure-sensitive electronic material, and disposed on an upper surface of the axis support;
   an axis component, disposed in the first opening and vertically movable with respect to the axis support and the pressure sensor layer;
   a keycap, mounted on the axis component and comprising a lower surface facing the upper surface of the axis support,
   wherein when the keycap is depressed, the lower surface of the keycap depresses the pressure sensor layer and an impedance of the pressure sensor layer varies according to a pressure applied on the keycap.

2. The key switch of claim 1, wherein the pressure sensor layer further comprises a second opening corresponding to the first opening, and the axis component is disposed in the first and second openings.

3. The key switch of claim 2, wherein the keycap further comprises a recess on the lower surface thereof.

4. The key switch of claim 3, wherein the area of the upper surface of the axis support is equal to or smaller than an area difference between the recess of the keycap and the axis component in a section view.

5. The key switch of claim 2, wherein a width of the pressure sensor layer at one side of the second opening is larger than a width of the pressure sensor layer at another side of the second opening in a section view.

6. The key switch of claim 1, wherein the pressure sensor layer is disposed at one side of the first opening and is rectangular.

7. The key switch of claim 1, wherein the pressure sensor layer is disposed at three sides of the first opening and is U-shaped.

8. The key switch of claim 1, wherein a conductance of the pressure sensor layer is positively correlated with the pressure applied on the pressure sensor layer.

9. The key switch of claim 1, wherein a minimal width of a surface of the pressure sensor layer facing the lower surface of the keycap is larger than 1 mm.

10. The key switch of claim 1, wherein the keycap further comprises a protruding part disposed on the lower surface and corresponding to the pressure sensor layer.

11. An analog pressure detection system, comprising:
    the key switch of claim 1;
    a voltage source, connected to the pressure sensor layer of the key switch through a reference resistor; and
    a voltage detector, connected to the voltage source and the pressure sensor layer.

* * * * *